United States Patent [19]

Bastide et al.

[11] 3,872,396

[45] Mar. 18, 1975

[54] OSCILLATOR CONTROL CIRCUIT

[75] Inventors: Paul Bastide, Paris; Robert Bonneton, Charenton, both of France

[73] Assignee: Compagnie Industrielle des Telecommunications Cit-Alcatel, Paris, France

[22] Filed: Nov. 6, 1973

[21] Appl. No.: 413,350

[30] Foreign Application Priority Data

Nov. 6, 1972 France ............................ 72.39206

[52] U.S. Cl. .................................. 331/1 A, 331/17

[51] Int. Cl. ............................................ H03b 3/04

[58] Field of Search ........ 307/233 A; 328/155, 134; 331/1 A, 17, 25

[56] References Cited

UNITED STATES PATENTS

| | | | |
|---|---|---|---|
| 3,441,342 | 4/1969 | Ball et al. | 328/155 X |
| 3,458,823 | 7/1969 | Nordahl | 328/155 |
| 3,465,276 | 9/1969 | Silva et al. | 328/155 X |
| 3,515,997 | 6/1970 | Babany | 307/233 A |
| 3,764,831 | 10/1973 | Zwitter et al. | 307/271 |
| 3,805,180 | 4/1974 | Widmer | 331/1 A |
| 3,824,483 | 7/1974 | Margala et al. | 331/1 A |

*Primary Examiner*—John S. Heyman
*Attorney, Agent, or Firm*—Craig & Antonelli

[57] ABSTRACT

Servo-control loop with an outside frequency affecting an oscillator for regulating by means of the voltage (VCO) formed by logic circuits operating in a wide band and comprising a means for adjusting the phase, giving a standard phase shift throughout the band.

11 Claims, 5 Drawing Figures

OSCILLATOR CONTROL CIRCUIT

The invention comes within the branch of devices ensuring the servo-controlling of the frequency of an oscillator which may be controlled by the voltage at a frequency of a signal given through a looped circuit which applies to the said oscillator an adequate control voltage, generated by a phase discriminator inserted in the loop. It concerns a looped circuit of the above type comprising essentially logic circuits. It is applied to the generating of a servo-controlled frequency whose phase may be varied according to a uniform law in a very wide frequency band, with a view to use for the demodulation of waves modulated by the displacement of pulses.

The invention has for its object a loop for servo-controlling the frequency of an oscillator controlled by the voltage (*f2*) at an incident frequency (*f1*) comprising a simple means for making the phase of the frequency generated vary in relation to the incident frequency, according to a uniform law in a very wide band (for example, exceeding 4 octaves).

It is a known practice to make the phase vary between two signals having the same frequency by inserting on one of them a delaying element, but if the frequency varies in a ratio of 15 to 20, as in the present case, such a dephasing method is quite inadequate, for every effort is made to obtain the same dephasing law throughout the range covered. This is not the case with a uniform delay law throughout the whole range.

The solution adopted by the inventors consists in applying two pulse trains, corresponding to the said frequencies to a logic circuit providing two complementary signals $Qo$, $\overline{Qo}$, which are applied to an integrator having two inputs $E_1$ and $E_2$ (+ and −) through two transfer networks, impedances $Z_1$ and $Z_2$ respectively. In the permanent state, the integrator supplies to the controlled oscillator a constant voltage corresponding to the adjustment $f2 = f1$. This is as much as to say that in the locking state, rectangular currents which are compensated exactly (form factor 1/1) reach the inputs of the integrator. It is immediately deduced therefrom that the said pulse trains at the input of the logic circuit must be in quadrature, inasmuch as the input circuits have identical impedance ($Z_1 = Z_2 = Z_0$). But if that identical state of impedance is altered, the compensation condition at the inputs of the integrator corresponds to a different phase relation between the pulse trains, hence between the incident frequency *f1* and the generator frequency *f2*. A simple variable resistor inserted in one of the two input circuits produces the condition $Z_1 = Zo$, $Z2 \neq Zo$, this causing a dephasing of the frequency *f2* in relation to the incident frequency *f1*, in the locking state, this dephasing being constant throughout the whole frequency range.

It will be observed that such a servo-control loop operates with a zero error signal, contrary to known servo-controlled loops which comprise a residual error signal.

The invention has furthermore remarkable particularities.

On the one hand, it is the integrator itself, energized by the difference between the frequencies *f1* and *f2* which provides to the oscillator the control voltage necessary for the preliminary search bringing the frequency *f2* within the capting radius of the servo-control.

On the other hand, in the case where the incident frequency *f1* happens to disappear temporarily, the logic circuit assumes a memory function, keeping for the frequency *f2* the value which it had at the instant of the disappearance of *f1*. When the frequency reappears (on condition that it has not varied appreciably), it immediately resumes its controlling function.

The invention will be described in detail with reference to the accompanying drawings among which:

Figure 1:
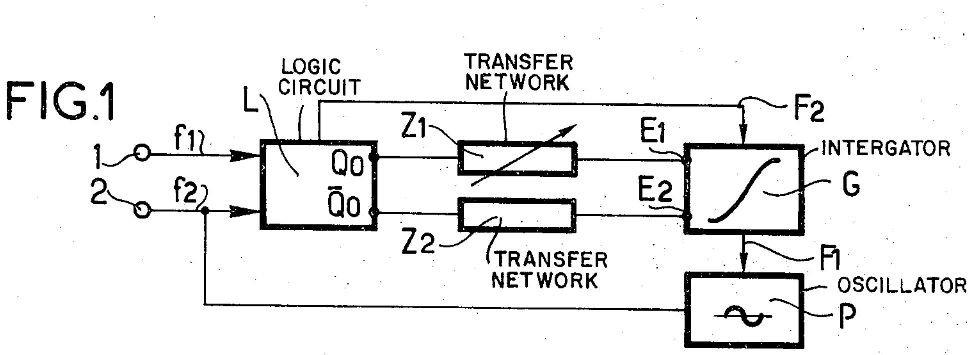
FIG. 1 is a simplified block diagram of a device according to the invention.

In FIG. 1 the assembly comprises a logic circuit L, which receives, through a terminal 1, currents having an incident frequency *f1* and through a terminal 2, currents having a frequency *f2* generated in the device and supplies to two complementary terminals $Q_o$, $\overline{Q_o}$, complementary rectangular signals. These signals pass through the transfer impedances Z1, Z2 (Z1 adjustable), respectively, and reach the inputs E1, E2 of the integrator G having two inputs, whose voltage output voltage (arrow F1) controls an oscillator P controlled by a voltage. When the locking between the frequencies *f1* and *f2* is not yet established or is cut off, the logic circuit L sends to the integrator a resetting to zero signal (arrow F2). The integrator G then positions the oscillator at its maximum frequency (for example, 400 kc/s), then, receiving, at its terminals E1, E2, the signals coming from the difference between the frequencies *f1* and *f2* applied to the logic circuit L, applies to the oscillator G a control voltage (negative) whose intensity increases until the arrival at equality of the frequencies *f1* = *f2*, this corresponding to a constant voltage at the output of the integrator G.

Figure 2:
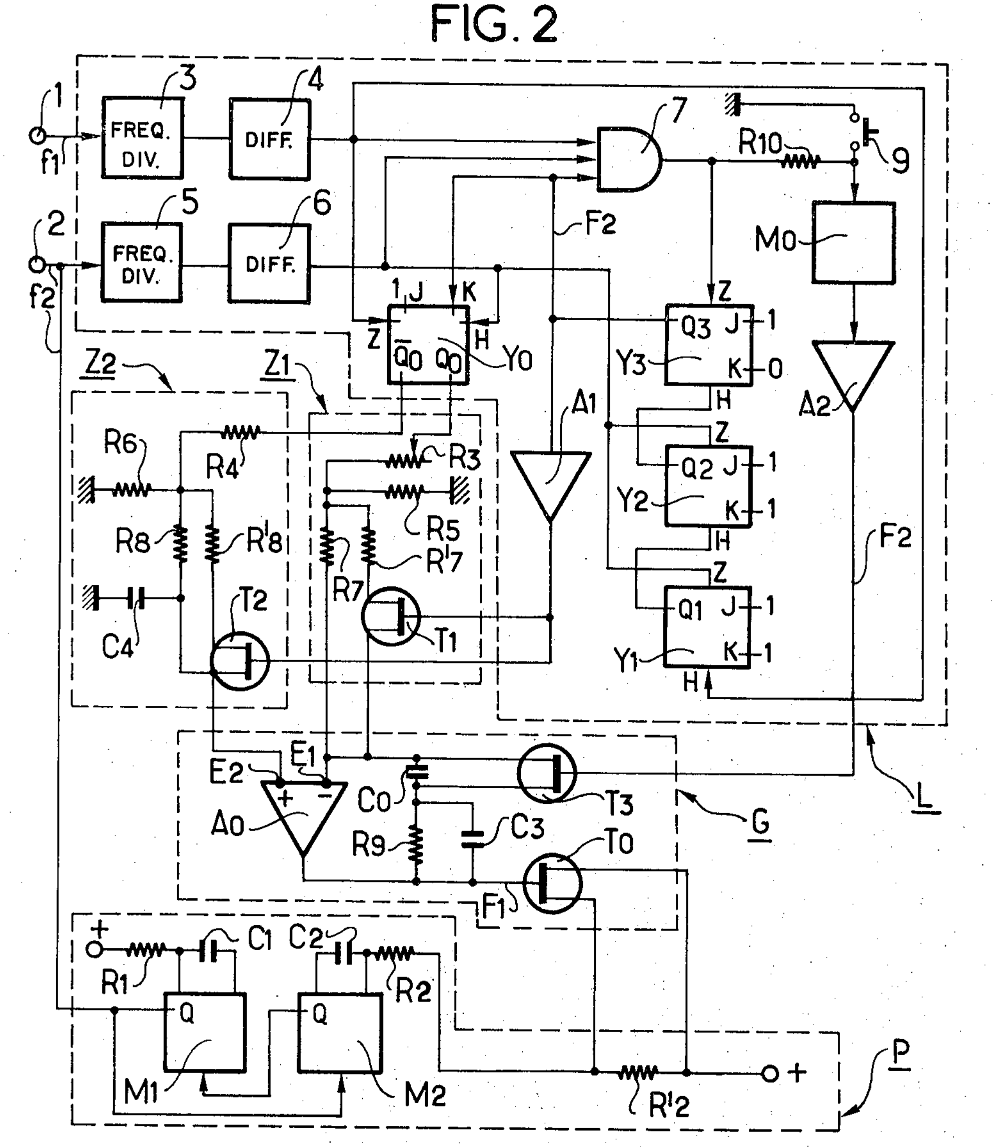
FIG. 2 is a general diagram.

In FIG. 2 the incident signal whose frequency is *f1* comes in through a terminal 1, passes through a frequency divider 3 dividing by N and a differentiator circuit 4 which provides fine pulses having a frequency of *f1*/N. The advantage of that frequency division will be seen herebelow.

The output frequency *f2* is supplied to a terminal 2. It also passes through a frequency divider 5 dividing by N and a differentiator circuit 6.

That frequency is generated by a variable frequency oscillator P comprising two monostable multivibrators M1, M2, in reciprocal reaction. The first has a time constant determined by two components, C1 and R1. The second has a time constant determined by a capacity C2 and a network of two resistors R2, R'2, the latter being shunted by a field effect transistor To, whose internal resistance is regulated by a continuous variable voltage.

By a variation in the regulating voltage applied to the field effect transistor To, such a circuit may cover a frequency band in a ratio greater than 10, for example, in a particular case of application, from 20 to 400 kc/s.

The logic circuit L comprises four bistable flip-flops Yo, Y1, Y2, Y3 and an AND gate 7. The bistable flip-flops are all of the same type — the JK "master-slave" flip-flop. They have a clock input H, an input reset to zero, called a "clear input", designated here by Z, and input J, an input K, two inputs $Qi$, $Qi$, $i$ designating the index peculiar to a flip-flop (Yo, Y1, Y2, Y3), on the flip-flops Y1, Y2, Y3 the outputs $\overline{Q}$ is not used.

The flip-flop Yo fulfills the function of a phase discriminator. The terminal Z of Yo is connected up to the output of the differentiator 4; its terminal H is connected up to the output of the differentiator 6. Its terminal J is at the logic level 1, the terminal K is connected up to the output Q3 of the flip-flop Y3 (see herebelow). Its output terminals Q*o*, $\overline{Qo}$ are connected up to the inputs E1, E2 of the input circuit of an amplifier A*o* connected up as an integrator, through two transfer networks Z1, Z2.

Three flip-flops Y1, Y2, Y3 form a detector circuit for detecting the exceeding of the frequency. Their connections are the following:

| | J | K | M | Z | Q |
|---|---|---|---|---|---|
| Y1 | 1 | 1 | output 4 | output 6 | H of Y2 |
| Y2 | 1 | 1 | Q1 | output 6 | H of Y3 (input 7) |
| Y3 | 1 | 0 | Q2 | output 7 | (terminal K of Yo) (input Al) |

fd

Reference numeral 7 is an AND gate having three inputs acting a a detector of coincidence between the pulses leaving 4 and the pulses leaving 6. The output of 7 is validated by the output signal of Q3. If Q3 is at 1, a coincidence pulse coming from 7 could be applied to the control input of a monostable multivibrator resistor R10.

The monostable multivibrator M*o* may also be tripped by a manual operation — earthing by the knob 9. The output signal of the monostable multivibrator M*o* is applied through an amplifier A2 controlling the conductivity to a field effect transistor T3 operating as a switch.

A differential amplifier A*o* having two inputs E1, E2 (− and +), has an input circuit with two transfer networks. The first impedance transfer network Z1, connected up at Q*o*, comprises a variable resistor R3 in series, a resistor R5 in parallel and, in series, two resistors R7, R′7 in parallel, the latter being in series with a field effect transistor T1. The second impedance transfer network Z2 connected up at $\overline{Qo}$ comprises a series resistor R4, a parallel resistor R6 and, in series, two resistors R8, R′8 in parallel, the latter being in series with a field effect transistor T2 and lastly, a capacitor in C4 in parallel, whose function is to supply a time constant to the second transfer network.

The amplifier A*o* is equipped as an integrator by a negative reaction circuit comprising a parallel network R9, C3 and a capacitor C*o*, which is shunted by a field effect transistor T3. The circuit output voltage of the integrator G is applied through F1 to the grid terminal of the field effect transistor T*o*.

The field effect transistor T*o* acts through its variable resistor on the frequency *f*2 supplied by the oscillator P.

The field effect transistors T1, T2, energized by an amplifier A1, connecting or cutting simultaneously the resistors R′7, R′8 respectively, supply to the integrator a short or long time constant.

The short time constant (relatively wide pass band) corresponds to the locking frequency search process. The long time constant (narrower pass band) corresponds to the locking state, which is all the less subject to the interference as the pass band of the servo control loop is narrower.

The field effect transistor T3 is put into a short-circuit state through an amplifier A2 (through F2) by the tripping of the monostable multivibrator M*o*. In these conditions, it discharges the capacitor C*o* of the integrator A*o*, this having the effect of bringing the frequency *f*2 to the maximum value. It will be shown herebelow that the charge accumulated on the capacitor C*o* and the output voltage increase through the operation of the integrator during the search phase, this having the effect of reducing the frequency *f*2 until the locking on the frequency *f*1 of the incident signal. At that instant, the voltage on C*o* becomes stabilized, as does the output voltage.

The monostable multivibrator M*o* is tripped either by manual control (knob 9) or automatically on an unlocking operation (output of 7).

The amplifiers A1 and A2 do not, actually speaking, operate as amplifiers. Their function is to supply an alignment of a signal from one continuous level to another continuous level.

The operation of the device will be described in greater detail with reference to FIG. 3.

Figure 3:
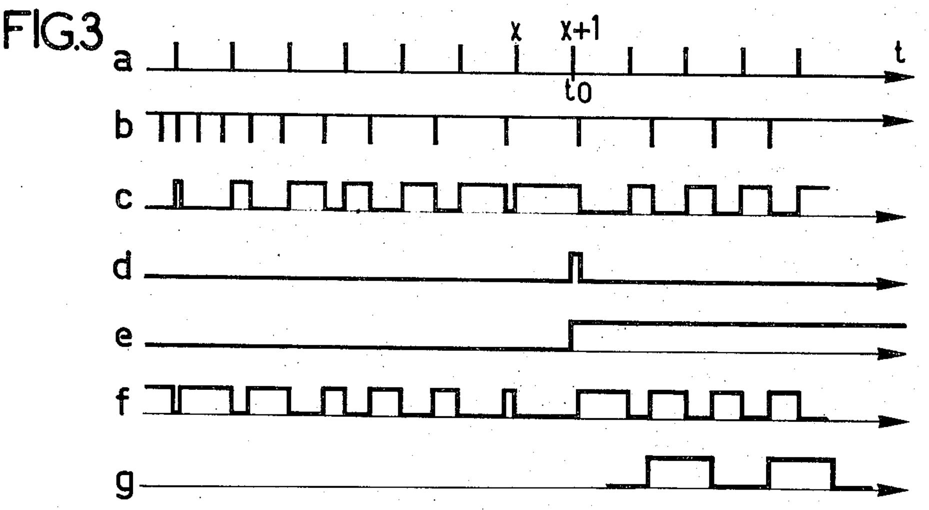
FIG. 3 is a set of graphs helping in understanding the operation.

FIG. 3 comprises seven graphs representing signals as a function of time during the end of a search and of a locking operation.

Graph *a* shows the positive pulses having a frequency *f*1/N reaching the terminal H of Y1.

Graph *b* shows the negative pulses having a frequency *f*2/N reaching the terminal Z of Y1 and the terminal Z or Y2.

Graph *c* shows the signals on Q1.

Graph *d* shows the signals on Q2.

Graph *e* shows the signals on Q3.

Graph *f* shows the signals on Q*o*.

Graph *g* shows the signals on Q*o* in the particular case where, after locking, the incident signal is canceled.

At the beginning of a search, there are many more pulses *b* than pulses *a*. After a pulse *a*, which sets Q1 to 1, a pulse *b*, which brings back Q1 to 0 (graph *c*), arrives.

At the end of each stage of Q1, Y2 receives at H a controlling descending wave front. But the effect of that pulse is canceled by the pulse *b* simultaneously reaching Z of Y2. Q2 remains at zero (graph *d*) which has the priority by construction of the bistable flip-flop.

The result of this on Q*o* (graph *f*) is a factor having a very different form from the ratio 1/1, when a variable voltage is applied to the field effect transistor T*o*, this reducing the frequency *f*2/N.

At the instant to, the frequency *f*2/N has decreased sufficiently for another pulse *a*, having an order of $x+1$ to arrive after a pulse *a* having an order of *x* before a pulse *b*. The descending wave front of Q1 sets the terminal Q2 of Y2 to 1, this falling back to zero on the pulse *b* which follows.

That temporary pulse reaching H of Q3 makes Q3 change over to 1 permanently (graph *e*).

The changing over of Q3 to 1 has the following consequences:

1. The coincident pulses which were inhibited up till now at the output of the gate 7 have a free passage towards the monostable multivibrator M*o*. This happens when, after a locking operation, unlocking occurs, this, bringing about a difference in the frequencies, makes coincidences appear rapidly.

The coincidences which occur during the search phase have no effect on Mo, for they are blocked by the Q3 = 0 applied to the gate 7.

2. The terminal K of Yo, which was at zero, changes over to 1. In the locking state, no consequence in the operation of Yo results therefrom.

3. The field effect transistors T1 and T2, which were conductive, having a negligible internal resistance, are cut off. The time constant of integration becomes longer.

Graph *f* shows that the factor having the form of the signal at Qo, which was very different from 1/1, becomes equal to 1/1 when the locking is effective, a fraction of a millisecond after to. If the circuits Z1 and Z2 are adjusted to the same value of impedance Z1 = Z2, the pulses *b* are exactly in the middle of the gap between two pulses *a*. That state is maintained during the whole of the locking period. There is therefore no coincidence pulse at the output of 7 as long as the locking is maintained.

If the condition Z1 = Z2 is not fulfilled, the pulses of one train are shifted in relation to the middle of the gap of the other train.

The locking is maintained even if the frequency *f* happens to vary, on condition that the variation be fairly slow.

If the signal having a frequency of *f*1 happens to disappear, the changeover to 1 of the terminal K of Yo ensures the tilting thereof on each pulse reaching H. The result thereof on Qo (and on $\overline{Qo}$, of course) is a signal having half the frequency (graph *g*) of the preceding case (graph *f*). But as the form factor is still 1/1, there is no disturbance at the output of the integrator — the frequency *f*2 is preserved. If, on the reappearance of the signal, its frequency *f*1 has not varied very much, the servo-controlling is preserved. That memory function preserves the frequency well, but does not preserve the phase.

Figure 4:
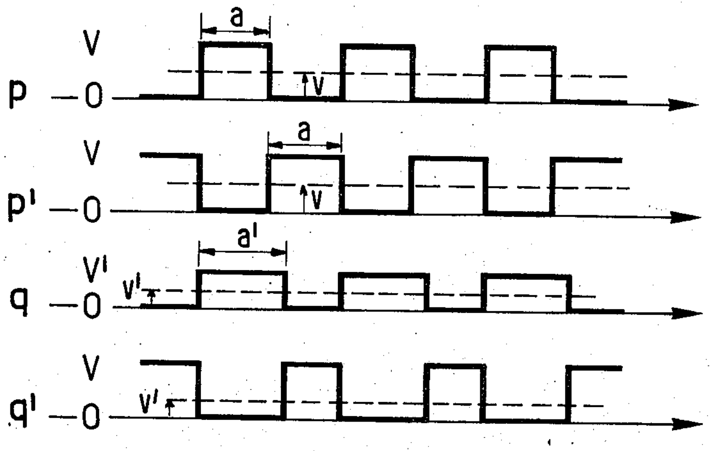
FIG. 4 shows curves illustrating the operation.

FIG. 4 shows the action of the variation of the resistor R3 (FIG. 2) on the adjusting of the phase of the wave having a frequency of F2 in relation to the wave having a frequency of *f*1.

FIG. 4 comprises four graphs grouped into complementary signals, *p*,*p'*, and *q*, *q'* at inputs $E_1$, $E_2$, respectively. It is assumed, for example, that the duration of a complete period covers 10 arbitrary units.

The graphs *p*, *p'* correspond to the case Z1 = Z2. The gating pulses *p* and *p'* have the same amplitude V (for example, V = 3 arbitrary units) and a factor having the form 1/1. The average *v* is equal to half of *v* for the gating pulses *p* and for the gating pulses *p'*. The positive gating pulses *p* and *p'* have the same width *a*, for example, *a* = 5 arbitrary units.

It is assumed that the variable resistance R3 is modified. The result of this is that Z1 ≠ Z2. Graph *q* shows that the gating pulses affected by the variation of R3 have, for example, an amplitude V' = 2, whereas the gating pulses *q'* retain their amplitude V = 3. The balance which is reestablished compulsorily (since the frequency has not changed) requires that the new average *v'* of the gating pulses *q* be equal to the new average of the gating pulses *q'*. An elementary calculation shows that the positive gating pulses *q* assume the width *a'* = 6 and that the positive gating pulses *q'* assume the complementary width 10 − 6 = 4.

That deviation of the factor of form of the rectangular signals reflects, according to an exactly rectilinear law, a dephasing between the pulse trains having a frequency of *f*1 and *f*2. The treating of the pulses being effected in the device on the frequencies *f*1/N and *f*2/N, the result of this is that a dephasing N. $\phi$ between the frequencies *f*1 and *f*2 corresponds, at the terminals 1 and 2, to a dephasing of adjustment of the value $\phi$ on the divided frequencies.

Figure 5:
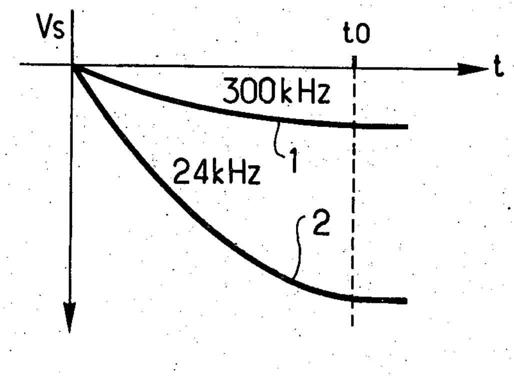
FIG. 5 shows the development of the locking process as a function of time.

FIG. 5 shows the variation of the voltage at the output of the integrator as a function of time.

That voltage, which is negative, starts from zero and reaches the permanent state value at the instant to (see FIG. 3).

The curve 1 shows the variation for an adjustment at the top of the range (for example, 300 kc/s), the curve 2 for an adjustment at the bottom of the range (24 kc/s).

The slope is relatively great at the outset and reduces, progressively, to cancel out at the arrival at the instant to of the locking. That characteristic which constitutes an advantage and procures progressive and hence reliable locking conditions, is supplied by the intrinsic constitution of the device.

The device and the operation thereof have been described in the case of an interconnection between the terminals Qo, $\overline{Qo}$ and the input terminals E1, E2 of the integrator.

Nevertheless, the same results may be attained for a single connection, for example between Qo and E, E2 being connected up to a continuous source. In that case, dephasing will be obtained by modifying the value of the continuous voltage applied to the input E2.

But the use of the two complementary signals Qo, $\overline{Qo}$ is a greater advantage, for it ensures the compensating of certain drifts, more particularly, thermal drifts.

What is claimed is:

1. A control circuit for servo-controlling the frequency generated by a control oscillator in accordance with the frequency of a control signal, said circuit providing a phase-adjustable frequency control loop and comprising logic circuit means connected to receive said control signal and the output of said control oscillator for providing first and second rectangular complementary signals on respective outputs, an integrator circuit, and first and second transfer networks connecting the respective outputs of said logic circuit means to said integrator circuit, the output of said integrator circuit being connected in control of the frequency of said control oscillator, one of said first and second transfer networks having a variable impedance.

2. A control circuit as defined in claim 1 wherein said logic circuit means includes means connected to said integrator circuit for setting said integrator circuit to zero.

3. A control circuit for servo-controlling the frequency generated by a control oscillator in accordance with the frequency of a control signal comprising logic circuit means connected to receive said control signal and the output of said control oscillator for providing first and second rectangular complementary signals on respective outputs, and integrator circuit, and first and second transfer networks connecting the respective outputs of said logic circuit means to said integrator circuit, the output of said integrator circuit being connected in control of the frequency of said control oscillator, one of said first and second transfer networks having a variable impedance, wherein said logic circuit means includes first and second frequency dividers connected to receive said control signal and the output of said control oscillator, respectively, first and second differentiators connected to the outputs of said first and second frequency dividers, and a phase discriminator having first and second inputs connected to said first and second differentiators and first and second outputs connected to said first and second transfer networks.

4. A control circuit as defined in claim 3 wherein said control oscillator comprises two monostable multivibrators connected in reciprocal reaction, characterized in that one of the monostable multivibrators is equipped with a first field effect transistor operating as a variable resistor, receiving on its control electrode the output of integrator circuit.

5. A control circuit as defined in claim 3 wherein said integrator circuit includes an integrator-amplifier having first and second input terminals connected to said first and second transfer networks and a feedback circuit including a capacitor.

6. A control circuit as defined in claim 5 wherein said logic circuit means further includes a first logic subassembly which is responsive to the outputs of said first and second differentiators for providing a first output when the output frequency of said control oscillator substantially equals the frequency of said control signal and a second output when these frequencies substantially differ.

7. A control circuit as defined in claim 6 wherein said logic circuit means further includes means responsive to the outputs of said first logic subassembly for controlling the impedance of said first and second transfer networks.

8. A control circuit as defined in claim 7 wherein said logic circuit means further includes a second logic subassembly connected to the outputs of said first and second differentiators and said first logic subassembly for resetting said integrator-amplifier to zero when said first logic subassembly provides said second output.

9. A control circuit as defined in claim 2 wherein said means for resetting said integrator-amplifier to zero includes a second field effect transistor connected in parallel to said capacitor and operating as a switch.

10. A control circuit as defined in claim 6 wherein when said first logic subassembly provides said second output, said phase discriminator operates as a divider by two of the frequency at the output of said second differentiator in the case of disappearance of the frequency at the output of said first differentiator.

11. A control circuit for servo-controlling the frequency generated by a control oscillator in accordance with the frequency of a control signal, said circuit comprising a phase-adjustable frequency control loop including logic circuit means connected to receive said control signal and the output of said control oscillator for providing first and second complementary signals on respective outputs, an integrator circuit for controlling the frequency generated by said control oscillator, first and second transfer networks connecting the respective outputs of said logic circuit means to said integrator circuit, one of said first and second transfer networks having a variable impedance, said logic circuit means including a frequency overshoot detection circuit for detecting when the frequency generated by said control oscillator differs from the frequency of said control signal, an initialization circuit responsive to said frequency overshoot detection circuit for setting said integrator circuit to zero, and a locking control circuit responsive to said frequency overshoot detection circuit for effecting a phase locking operation when the frequency generated by said control oscillator becomes equal to the frequency of said control signal.

* * * * *